United States Patent
Hisada et al.

(10) Patent No.: US 7,173,802 B2
(45) Date of Patent: Feb. 6, 2007

(54) TEMPERATURE PROTECTION DEVICE FOR POWER DEVICES

(75) Inventors: Takeyoshi Hisada, Hekinan (JP); Fukuo Ishikawa, Kariya (JP)

(73) Assignee: Anden Co., Ltd., Anjo (JP)

( * ) Notice: Subject to any disclaimer, the term of this patent is extended or adjusted under 35 U.S.C. 154(b) by 643 days.

(21) Appl. No.: 10/683,114

(22) Filed: Oct. 14, 2003

(65) Prior Publication Data
US 2005/0105233 A1   May 19, 2005

(30) Foreign Application Priority Data
Oct. 16, 2002   (JP) .............................. 2002-301997

(51) Int. Cl.
*H02H 3/00* (2006.01)
(52) U.S. Cl. ..................... 361/93.8; 361/103
(58) Field of Classification Search ............... 361/93.8, 361/103
See application file for complete search history.

(56) References Cited

U.S. PATENT DOCUMENTS 5,883,507 A * 3/1999 Yin ........................... 323/316
6,205,010 B1 * 3/2001 Ohsaka et al. .............. 361/103
6,349,023 B1 * 2/2002 Greenberg .................. 361/103
2002/0109935 A1 * 8/2002 Korbel et al. ............. 360/78.06

FOREIGN PATENT DOCUMENTS

JP     A-2001-313364     11/2001

* cited by examiner

*Primary Examiner*—Ronald Leja
(74) *Attorney, Agent, or Firm*—Posz Law Group, PLC

(57) ABSTRACT

In a temperature protection device for power devices of the present invention, detected temperatures of power devices are compared with respective threshold values by determination units. If either one of the determination units determines that there is abnormal heat build-up of the respective power devices, the output of that determination units is maintained by a latch circuit, and the current carried by the power device subject to abnormal heat build-up is interrupted. In addition, due to the output of the determination units making the determination, the threshold value of the other determination units is changed to a temperature threshold value that is higher than that set previously, so that it is not determined that the normally operating power device is subject to abnormal heat build-up. This changing of the threshold value is only executed for a fixed time period based upon a timer circuit.

8 Claims, 6 Drawing Sheets

TEMPERATURE PROTECTION DEVICE FOR POWER DEVICES

CROSS REFERENCE TO RELATED APPLICATION

This application is based upon and claims the benefit of Japanese Patent Application No. 2002-301997 filed on Oct. 16, 2002, the content of which are incorporated herein by reference.

FIELD OF THE INVENTION

The present invention relates to a temperature protection device for power devices.

RELATED ART OF THE INVENTION

Recently, multi-channel power ICs have been realized in which a plurality of power devices (for example, MOS transistors) for carrying current to a load are housed in the same package.

Art has been disclosed (for an example refer to Japanese Patent-Laid-Open Publication No. 2001-313364) for this type of multi-channel power IC, in which a temperature of each power devices is respectively detected. When the detected temperature of at least one of the power devices is determined to be equal to or above a predetermined threshold value, it is taken that the temperature is abnormal (namely, abnormal heat build-up), and current carried by all of the power devices is interrupted.

However, with the above described power IC, when it is determined that the detected temperature of one of the power devices is equal to or above the predetermined threshold value, current carried by all of the power devices is interrupted, rather than just that of the related power device. Accordingly, the configuration is such that current carried by the normally operating power devices is also interrupted.

In order to address this problem, a possible proposal is to determine whether the detected temperature for each power device has risen as far as the predetermined temperature; current-carrying may then be interrupted individually for any of the power devices whose detected temperature has risen to the predetermined temperature. In this case, when one of the power devices is subject to abnormal heat build-up due to a load short, the heat from this power device is transmitted to the adjacent power devices. Thus, regardless of whether these power devices are operating normally, their temperature becomes higher than the predetermined threshold value. Accordingly, current carried by these power devices is also interrupted.

SUMMARY OF THE INVENTION

It is an object of the present invention to provide a temperature protection device for power devices in which current carried by a power device that is operating normally is not interrupted due to being affected by heat from a power device that is subject to abnormal heat build-up.

In order to achieve the above object, in the present invention, a determination unit compares respective temperatures of a plurality of power devices; these temperatures are detected by a temperature detection unit. If it is determined that the temperature of any one of the power devices has increased up to a threshold value, current carried by the power device whose temperature has increased is interrupted; at the same time, a threshold value used by the determination unit for the other power devices that are disposed in positions at which they are subject to thermal effects from the power device whose temperature has increased is changed to a threshold value that is set at a higher temperature than the previous threshold value.

According to the present invention, if the temperature of a power device which is operating normally is increased due to being thermally affected by a power device subject to abnormal heat build-up, the threshold value for the normally operating power device is changed to a higher temperature threshold value. Accordingly, it is possible to inhibit interruption of the current carried by the power device that is operating normally.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENTS

Figure 1:
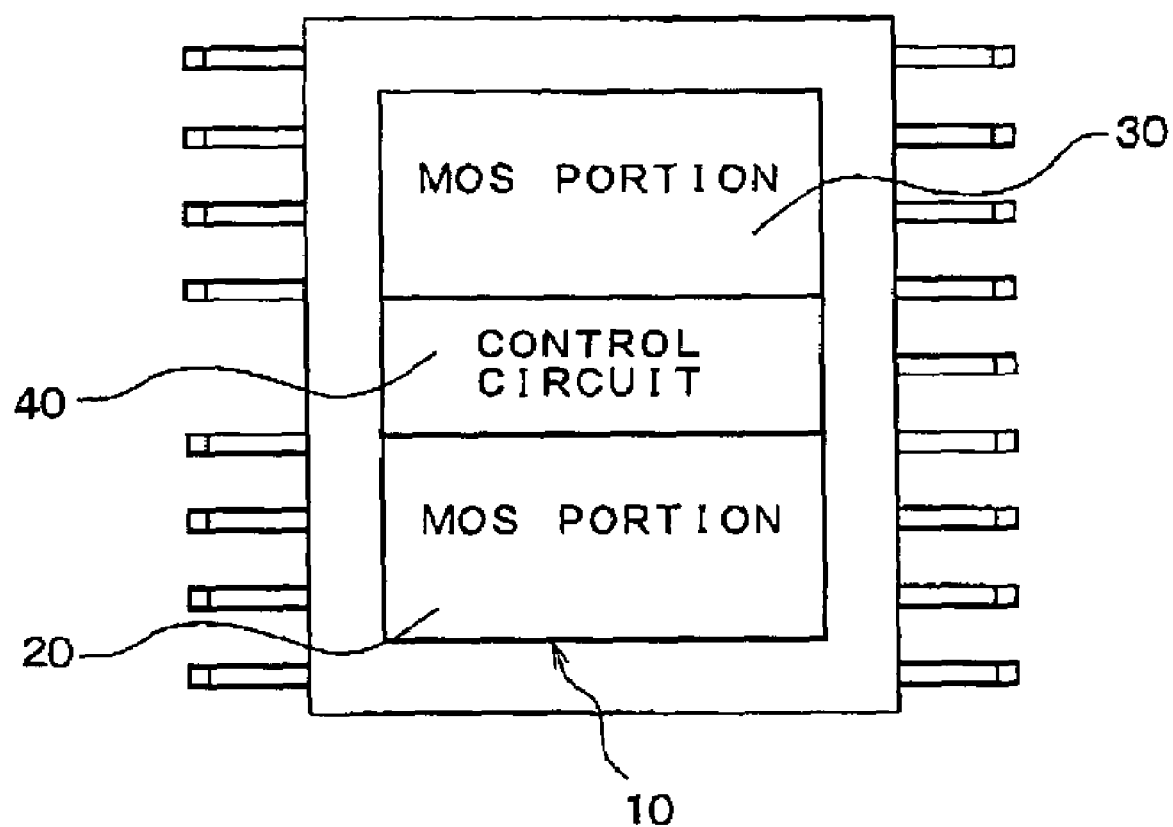
FIG. 1 shows a configuration of an on-vehicle power IC according to a first embodiment of the present invention.

The present invention will be described further with reference to various embodiments in the drawings.

(First Embodiment)

Figure 2:
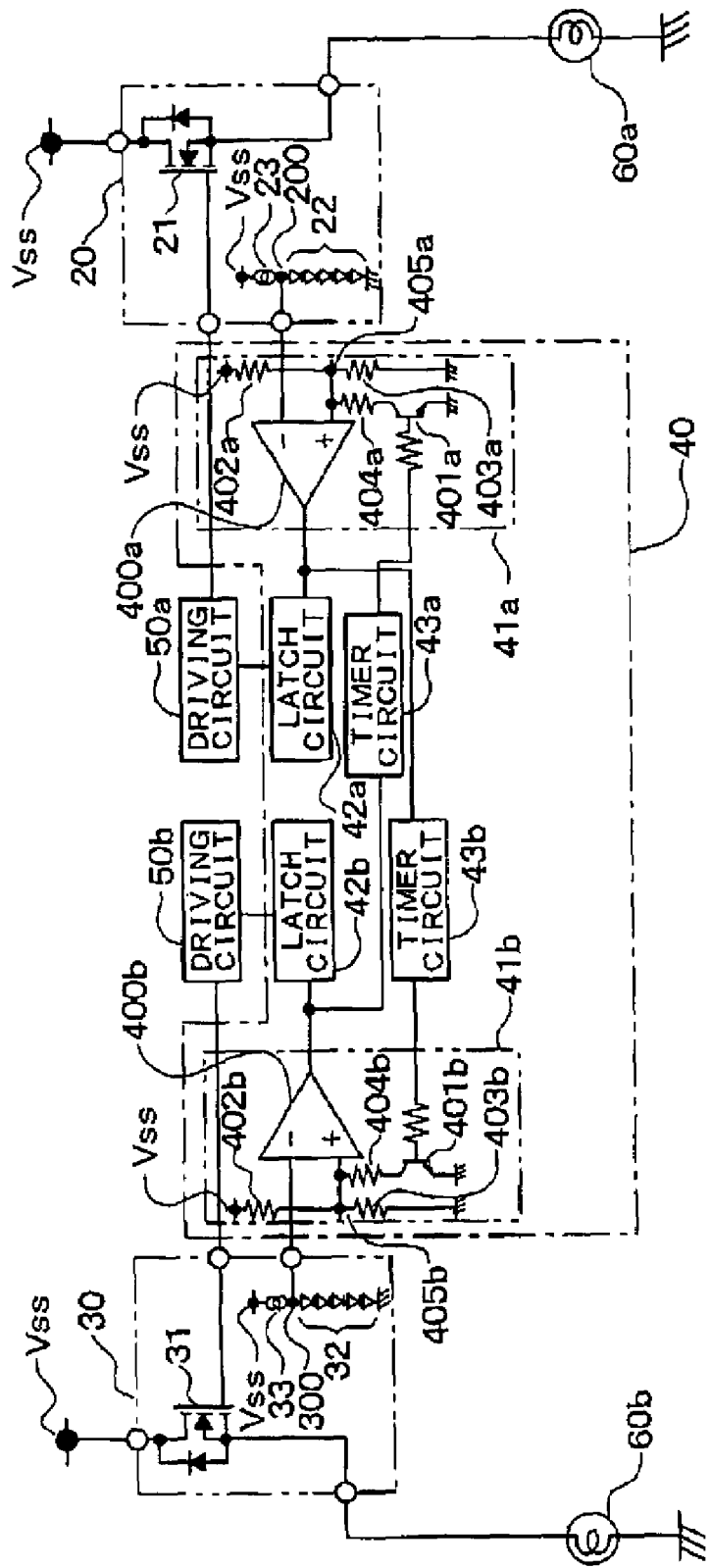
FIG. 2 shows a circuit configuration of the on-vehicle power IC of FIG. 1.

FIG. 1 shows a configuration of an on-vehicle power IC to which a temperature protection device of a power device according to the present invention has been applied. FIG. 2 shows a circuit configuration of this on-vehicle power IC.

The on-vehicle power IC is formed by resin molding a single chip 10 as one package. As shown in FIG. 1, the chip 10 is provided with a first and a second MOS portions 20 and 30, and a control circuit portion 40. The first and the second MOS portions 20 and 30 are arranged so as to sandwich the control circuit portion 40. The MOS portions 20 and 30 are arranged in positions at which they mutually subject each other by thermal effects.

It should be noted that the first and the second MOS portions 20 and 30, as shown in FIG. 2, are controlled respectively by driving circuits 50a and 50b; the MOS portions 20 and 30 carry and interrupt current to respective lamps 60a and 60b (for example, headlamps of the vehicle) that corresponds the load. Further, the control circuit portion 40 executes forcible interruption of current carried by the MOS portions 20 and 30, when there is abnormal heat build-up of the first and the second MOS portions 20 and 30.

The first MOS portion 20 is provided with an N type MOS transistor 21 that is a power device configured as a semiconductor switching device. The MOS transistor 21 is connected between a power source Vss and the lamp 60a, and carries current and interrupts current to the lamp 60a.

Moreover, the first MOS portion 20 is provided with a temperature detection portion 22 and a constant current circuit 23, in order to detect a temperature of the MOS transistor 21. The temperature detection portion 22 is configured from a plurality of diodes that are connected in series. Each diode is disposed in the vicinity of the MOS transistor 21. A respective forward voltage of each diode is reduced along with a temperature increase of the MOS transistor 21. By supplying the constant current from the constant current circuit 23 to the temperature detection portion 22, a temperature detection signal is output in accordance with a temperature of the MOS transistor 21 from a common connection terminal 200 of each diode and the constant current circuit 23. This temperature detection signal is a signal whose voltage level reduces as the temperature of the MOS transistor 21 increases. The temperature detection signal is input to an inverting input terminal (□) of a comparator 400a.

The second MOS portion 30 is provided with a MOS transistor 31, a temperature detection portion 32, and a constant current circuit 33. The MOS transistor 31, the temperature detection portion 32, and the constant current circuit 33 have, respectively, the same configurations as the MOS transistor 21, the temperature detection portion 22, and the constant current circuit 22.

The control circuit portion 40 is configured from comparison/threshold value changing circuits 41a and 41b, latch circuits 42a and 42b, and timer circuits 43a and 43b.

The comparison/threshold value changing circuits 41a is provided with a comparator 400a, a transistor 401a, resistors 402a and 403a, and a resistor 404a.

The transistor 401a, the resistors 402a and 403a, and the resistor 404a form a circuit that sets a threshold voltage. Amongst these members, the transistor 401a and the resistor 404a form the threshold value changing circuit that switches the threshold voltage. In other words, when the transistor 401a is OFF, a voltage defined by dividing the power source Vss by the resistors 402a and 403a is set as the threshold voltage. When the transistor 401a is ON, the resistor 404a is connected in parallel with the resistor 403a, and the threshold voltage is switched to a value that is lower than the previous one. The threshold voltage is input to the non-inverting input terminal (□) of the comparator 400a from the common connection terminal 405a.

The comparator 400a compares the temperature detection signal input to the inverting input terminal and the threshold voltage input to the non-inverting input terminal. When the temperature detection signal is lower than the threshold voltage, a high level abnormal heat build-up detection signal is output. More specifically, when the temperature of the MOS transistor 21 becomes higher than a temperature that corresponds with the threshold voltage described above, the comparator 400a outputs the high level abnormal heat build-up detection signal.

When the high level abnormal heat build-up detection signal is output from the comparator 400a, the latch circuit 42a maintains the signal and outputs it to the driving circuit 50a, so as to interrupt the current carried by the MOS transistor 21.

When the high level abnormal heat build-up detection signal is output from the comparison/threshold value changing circuit 41b, the timer circuit 43a outputs the high level abnormal heat build-up detection signal to the transistor 401a. At the same time, the timer circuit 43a starts a counting operation; when a fixed time period count is completed, a low level signal is output to the transistor 401a, and the transistor 401a is switched to OFF.

Moreover, the comparison/threshold value changing circuit 41b, the latch circuit 42b, and the timer circuit 43b are configured in the same manner as the comparison/threshold value changing circuit 41a, the latch circuit 42a, and the timer circuit 43a, respectively.

Figure 3:
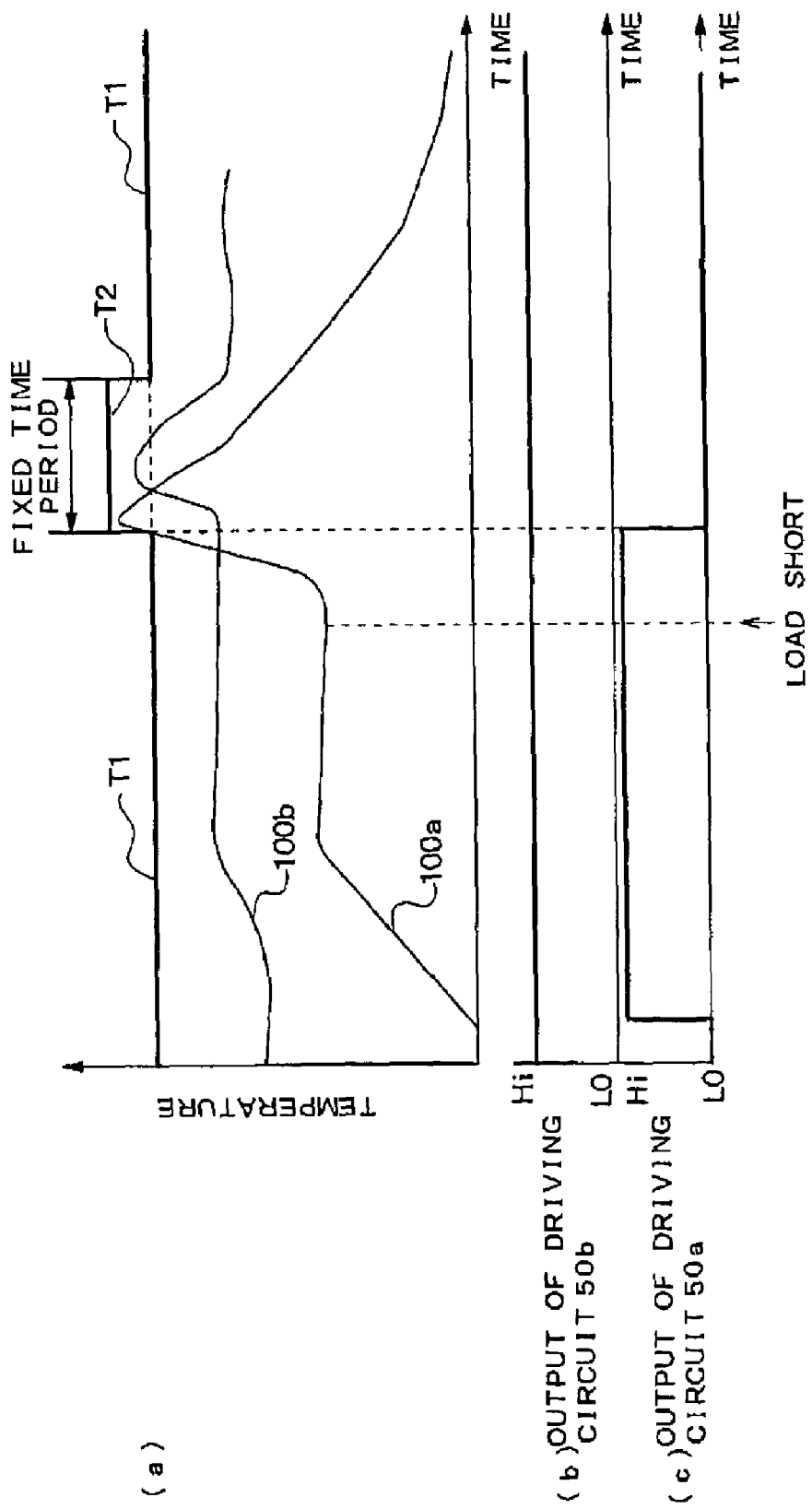
FIG. 3 is a figure that illustrates the operation of the on-vehicle power IC shown in FIG. 1.

The operation of the on-vehicle power IC configured as described above will be explained with reference to FIGS. 3A to 3C. FIG. 3A shows changes in the temperature of the MOS transistors 21 and 31, and changes in a temperature threshold value (which corresponds to the threshold voltage) used in the comparator 400a and a comparator 400b. FIG. 3B shows an output signal of the driving circuit 50b, and FIG. 3C shows an output signal of the driving circuit 50a.

First, as shown by FIG. 3B, when the driving circuit 50b outputs a high level signal to a gate terminal of the MOS transistor 31, the MOS transistor 31 is switched to ON, and current is carried to the lamp 60b. Note that the MOS transistor 31 is subject to heat build-up in accordance with current carried from the power source Vss. Accordingly, the temperature of the MOS transistor 31 increases as shown by a line denoted by a reference number 100b shown in FIG. 3A.

Further, when the driving circuit 50a outputs a high level signal to the gate terminal of the MOS transistor 21, as shown by FIG. 3C, the MOS transistor 21 is switched to ON, and current is carried to the lamp 60a. Note that the MOS transistor 21 is subject to heat build-up in accordance with current carried from the power source Vss. Accordingly, the temperature of the MOS transistor 21 increases as shown by a line denoted with a reference number 100a shown in FIG. 3A.

Following this, in the case of a load short, for example, when the positive terminal of the lamp 60a short circuits to ground, an overcurrent flows to the MOS transistor 21 from the power source Vss. Thus, the temperature of the MOS transistor 21 increases rapidly. Along with this, the level of the temperature detection signal input to the inverting input terminal of the comparator 400a from the common connection terminal 200 falls rapidly.

In addition, when the temperature of the MOS transistor 21 rises to T1, the temperature detection signal becomes smaller than the threshold voltage input to the non-inverting input terminal of the comparator 400a. Accordingly, the output of the comparator 400a switches to the high level, and the latch circuit 42a maintains this high level signal and outputs it to the driving circuit 50a. As a result, the driving circuit 50a outputs the low level signal to the gate terminal of the MOS transistor 21. Thus, the MOS transistor 21 is switched to OFF, and the current carried to the lamp 60a is interrupted.

It should be noted that, in this embodiment, a temperature detection time, a masking time, and a circuit activation delay time of the comparator 400a, and so on, are generated. Accordingly, the switching OFF of the output of the driving circuit 50a is delayed slightly. In other words, once the temperature of the MOS transistor 21 increases to T1, the output of the driving circuit 50a switches to the low level following a slight delay. In addition, the MOS transistor 21 switches completely to OFF after a turn off time has elapsed following switching to OFF of the driving circuit 50a. Moreover, the MOS transistor 21 is subject to substantial heat loss during the turn off time. Accordingly, even after the temperature of the MOS transistor 21 (refer to 100a in FIG. 3A), has exceeded T1, the MOS transistor 21 is subject to slight heat build-up.

Moreover, when the output of the comparator 400a changes from the low level to the high level, the timer circuit 43b starts a fixed time period count, and at the same time, outputs the high level signal to the transistor 401b of the comparison/threshold value changing circuit 41b. Accordingly, the transistor 401b is switched to ON, and the resistor 404b is connected in parallel with the resistor 403b. Thus, the threshold voltage input to the non-inverting input terminal of the comparator 400b reduces. In other words, the threshold value for abnormal heat build-up for the temperature of the MOS transistor 31 becomes larger than before, and, as shown in FIG. 3A, is switched to a threshold value T2 that is a higher temperature than the threshold value T1 used previously.

Note that, as described above, when the temperature of the MOS transistor 21 increases due to the overcurrent, heat energy from the MOS transistor 21 is transmitted to the second MOS portion 30. Thus, the temperature of the MOS transistor 31 of the second MOS portion 30 increases, and exceeds T1. However, since the threshold value for the abnormal heat build-up for the temperature of the MOS transistor 31 in the comparator 400b has been changed to T2 (which is greater than T1), the output of the comparator 400b does not change to the high level. Accordingly, the MOS transistor 31 is able to execute normal operation in the same manner as before.

Moreover, due to interrupting the current carried by the MOS transistor 21, the temperature of the MOS transistor 21 reduces; accompanying this, transmission of heat energy to the second MOS portion 30 is inhibited. Accordingly, once the temperature of the MOS transistor 31 has exceeded the temperature T1, as shown by a line denoted by a reference number 100b shown in FIG. 3A, the temperature falls back to a temperature less than T1 prior to elapsing of the fixed time period of counting of the timer circuit 43b.

Following this, once the timer circuit 43b has completed the fixed time period of counting, the transistor 401b is switched to OFF. Accordingly, the threshold value for abnormal heat build-up for the temperature of the MOS transistor 31 is changed back from T2 to T1.

As explained above, according to this embodiment of the present invention, when either one of the MOS transistors 21 and 31, which are the first and the second power devices, is subject to heat build-up, the current carried by the subject MOS transistor is interrupted, and the temperature threshold value for abnormal heat build-up of the other MOS transistor is increased from T1 to T2. Accordingly, even if the temperature of the other MOS transistor increases due to transmission of heat energy from the abnormal heat build-up of the subject MOS transistor, detection of abnormal heat build-up of the other MOS transistor does not occur. Thus, it is possible for normal operation of the other MOS transistor to be maintained.

Moreover, when the abnormal heat build-up of the subject MOS transistor occurs, the current carried by the subject MOS transistor is interrupted. Accordingly, the temperature of the subject MOS transistor falls, and along with this, the temperature of the other MOS transistor also falls. In addition, once abnormal heat build-up of the other MOS transistor has been detected, the temperature threshold value for abnormal heat build-up of the other MOS transistor is changed back from T2 to T1, after the fixed time period has elapsed. Accordingly, following elapse of the fixed time period, as compared to during the fixed time period, it is possible to inhibit occurrence of damage of the other MOS transistor by increasing the degree of difference between the threshold value and the temperature at which damage of the MOS transistor occurs.

(Second Embodiment)

In the first embodiment described above, the threshold value is returned to its original value following elapse of the fixed time period, using the timer circuit. However, in the second embodiment, the threshold value is returned to its original value based on the temperature of the MOS transistor that is subject to abnormal heat build-up.

Figure 4:
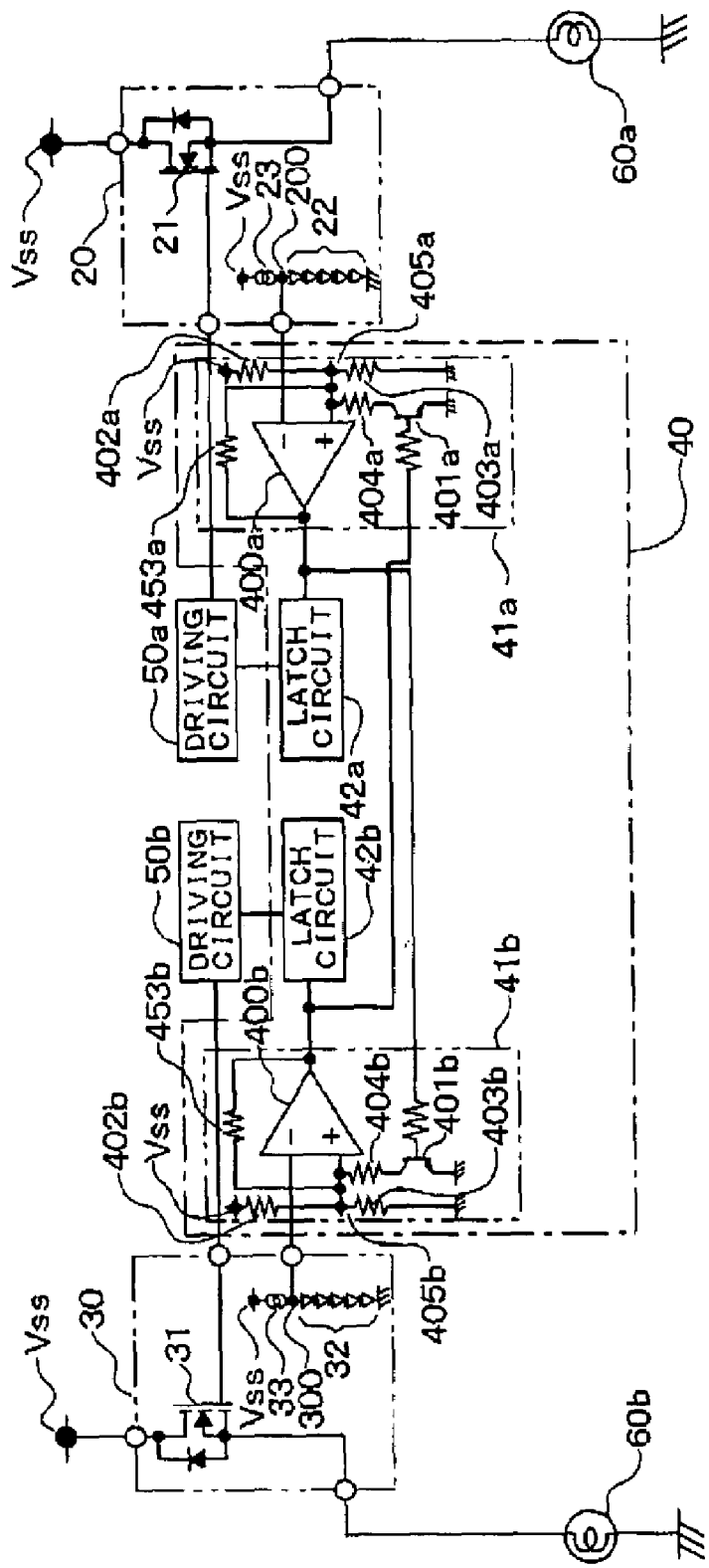
FIG. 4 shows a circuit configuration of an on-vehicle power IC according to a second embodiment of the present invention.

FIG. 4 shows a circuit configuration of an on-vehicle power IC used in this case. The on-vehicle power IC of the second embodiment has the same configuration as shown in FIG. 2, except that the timer circuits 43a and 43b are omitted, and the resistors 453a and 453b are added to the comparison/threshold value changing circuits 41a and 41b. The resistor 453a is connected between an output terminal and the non-inverting input terminal of the comparator 400a of the comparison/threshold value changing circuit 41a. The resistor 453b is connected between the output terminal and the non-inverting input terminal of the comparator 400b of the comparison/threshold value changing circuit 41b. Further, the transistor 401b is directly controlled by the output signal of the comparator 400a, and the transistor 401a is directly controlled by the output signal of the comparator 400b.

In the second embodiment, during normal operation when the MOS transistor 21 is not subject to abnormal heat build-up, the output of the comparator 400a is the low level. Thus, the resistor 453a is connected in parallel with the resistor 403a. In addition, the threshold voltage (the same threshold voltage as in the first embodiment) during normal operation is set by the resistors 402a, 403a, and 453a. Similarly, the threshold voltage during normal operation for the comparator 400b is set by the resistors 402b, 403b, and 453b.

In the case that one of the MOS transistors 21 or 31, for example, the MOS transistor 21, becomes subject to abnormal heat build-up, the output of the comparator 400a changes to the high level. This output is maintained by the latch circuit 42a, and then output to the driving circuit 50a. Thus, current carried by the MOS transistor 21 is interrupted.

Figure 5:
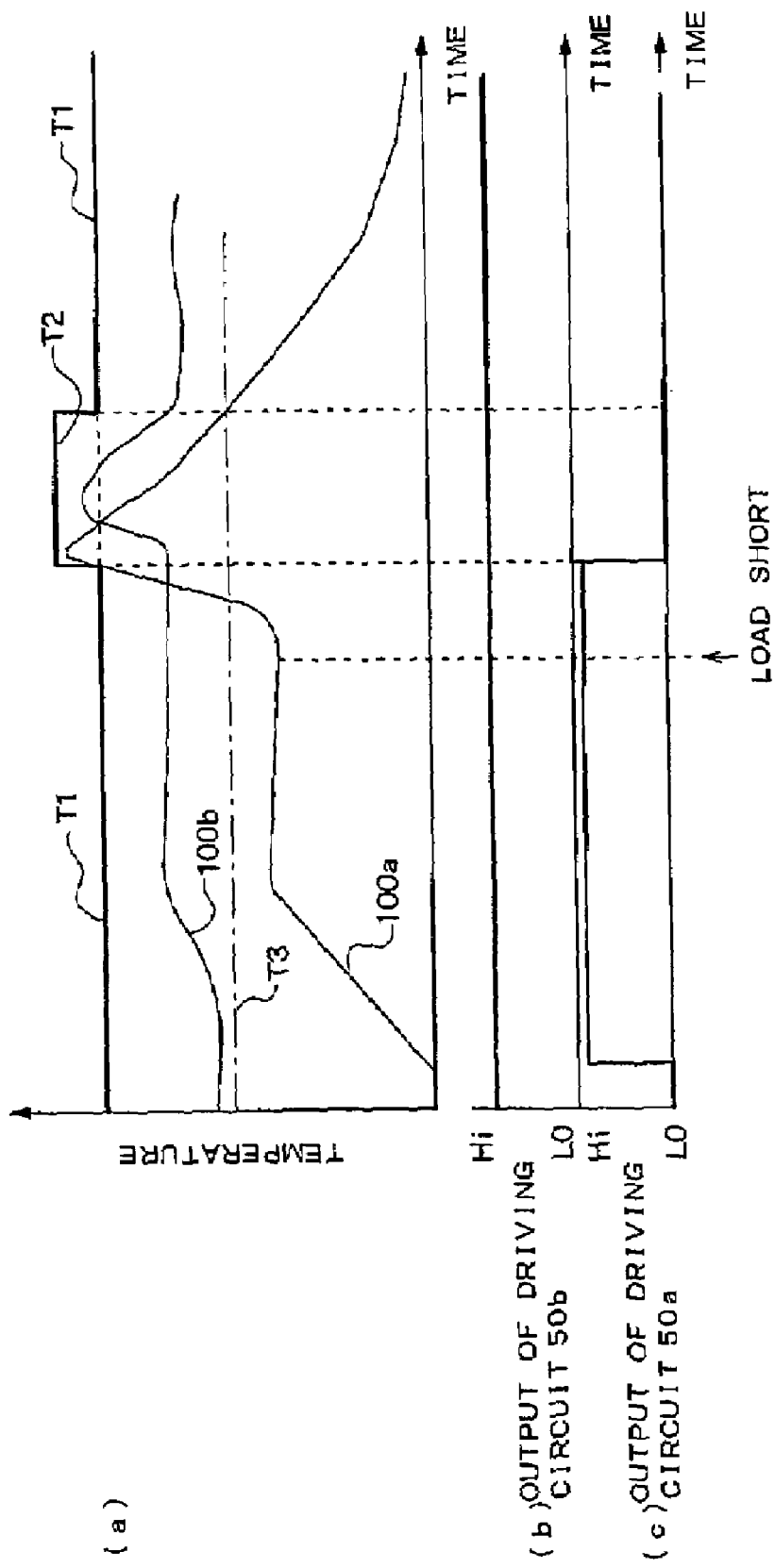
FIG. 5 is a figure that illustrates the operation of the on-vehicle power IC shown in FIG. 4.

At this time, the transistor 401b is switched to ON by the high level output of the comparator 400a. Accordingly, the threshold value for abnormal heat build-up of the comparator 400b is changed from T1 to T2. In addition, the resistor 453a is connected to the power source Vss instead of the ground due to the output of the comparator 400a changing to the high level. Thus, the resistor 453a is connected in parallel with the resistor 402a, and as a result of this, the threshold voltage input to the non-inverting input terminal of the comparator 400a increases. In other words, the threshold value for the temperature of the MOS transistor 21 becomes lower than it has been up to now; as shown in FIG. 5A, the threshold value is changed to a temperature threshold value T3 that is lower than the threshold value T1 used previously.

Following this, the temperature of MOS transistor 21 falls due to interruption of the carried current. When the temperature falls to T3, the output of the comparator 400a changes from the high level to the low level. Accordingly, the transistor 401b is switched to OFF, and the threshold value for abnormal heat build-up for the temperature of the MOS transistor 31 is returned back from T2 to T1.

(Modifications)

(1) In the second embodiment as described above, the configuration is such that the resistors 453a and 453b are connected between the respective output terminal and the respective non-inverting input terminal of the comparators 400a and 400b so as to lower the threshold value for the temperature of the comparator that executed the abnormal heat build-up determination. In this case, the temperature of the MOS transistor subject to abnormal heat build-up falls to T3, and the threshold value for the temperature of the other MOS transistor is returned back from T2 to T1. However, other than this configuration, for example, a separate comparator may be provided that compares the temperature of the MOS transistor subject to abnormal heat build-up with the threshold value T3; when the temperature of the MOS transistor subject to abnormal heat build-up falls to T3, the threshold value for the temperature of the other MOS transistor is returned back from T2 to T1.

(2) In each of the above described embodiments the single chip 10 formed in one package by resin molding was adopted as the on-vehicle power IC. However, the on-vehicle power IC may be formed by resin molding a plurality of chips within a single package with each chip provided with a MOS portion.

Figure 6:
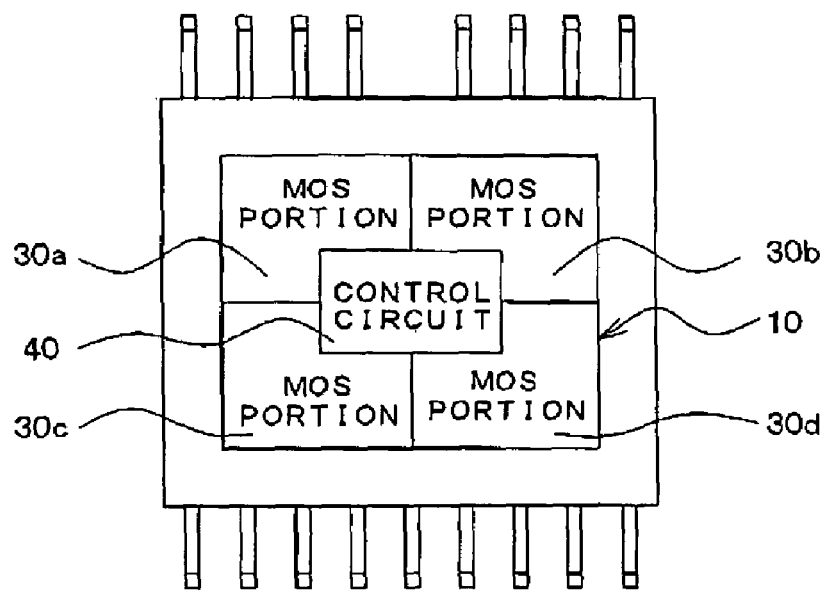
FIG. 6 shows a configuration of an on-vehicle power IC according to another embodiment of the present invention.
Figure 7:
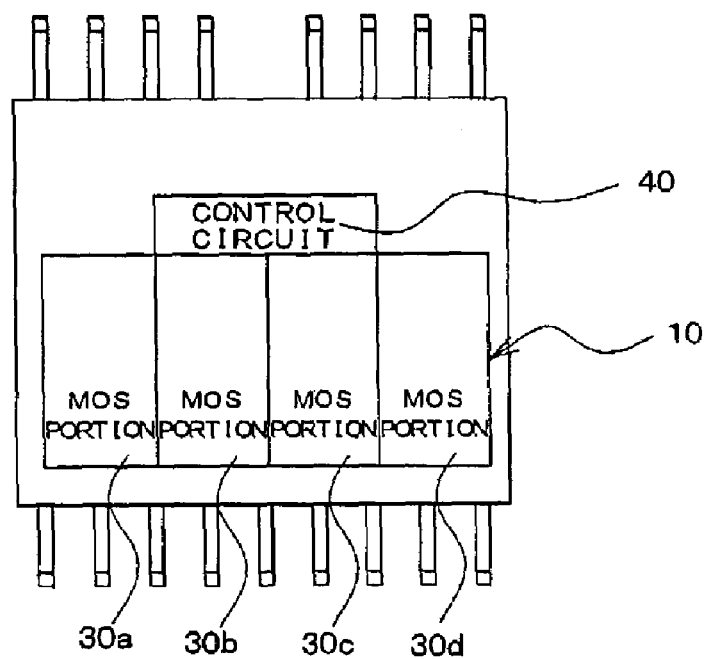
FIG. 7 shows a configuration of an on-vehicle power IC according to yet another embodiment of the present invention.

(3) For each of the above described embodiments, the configuration is such that, within a single chip 10, the first and the second MOS portions 20 and 30 are disposed so as to sandwich the control circuit portion 40. However, as shown in FIG. 6, the configuration may be such that MOS portions 30a, 30b, 30c and 30d are disposed so as to surround the control circuit portion 40. Moreover, as shown in FIG. 7, the MOS portions 30a, 30b, 30c and 30d may be arranged in a row. In this case, when any one of the MOS portions is subject to abnormal heat build-up, the respective threshold values for abnormal heat build-up for all the other MOS portions may be changed. Alternatively, the threshold value for abnormal heat build-up may only be changed for: any of the MOS portions adjacent to the MOS portion subject to abnormal heat build-up; or any of the MOS portions disposed in positions that are thermally affected by the MOS portion subject to abnormal heat build-up.

(4) In each of the above described embodiments, the timer circuits 43a and 43b executed counting for the fixed time period. However, it is sufficient that this counting time is long enough to ensure that the temperature falls to the threshold value T1 or below following inhibition of transmission of heat energy due to interrupting the current carried by the MOS transistor subject to abnormal heat build-up. Therefore, the counting time may also be a value that is varied in accordance with another factor, such as a temperature gradient of the MOS transistor that is subject to abnormal heat build-up.

(5) In each of the above described embodiments, the MOS transistor is adopted as the power device. However, devices such as a bi-polar transistor, an IGBT, or the like, may be adopted.

(6) in each of the above described embodiments, the temperature detection portions 22 and 23 configured from the diodes act as a temperature detection unit for detecting the individual temperatures of the plurality of power devices housed within the same package. However, various types of temperature detection device, such as a thermistor, may be adopted.

(7) In each of the above described embodiments the threshold values for temperature during normal operation set in the comparators 400a and 400b, are set respectively as first and second threshold values, with both threshold values set to the same value. However, the threshold values may be set to different values depending on the application of the temperature protection device.

(8) In each of the above described embodiments, the control circuit 40 and the MOS portions 20 and 30 are housed within the same package. However, the control circuit portion 40 and the MOS portion 20 and the MOS portion 30 may be housed within different packages.

(9) In each of the above described embodiments, the control circuit portion 40 is configured using hardware. However, the control circuit portion 40 may be configured using software that utilizes a computer program.

(10) In each of the above described embodiments, an example was described using an on-vehicle power IC as the IC provided with the MOS portions 20 and 30 and the control circuit portion 40. However, the MOS portions 20 and 30 and the control circuit portion 40 may be provided in ICs mounted in various other instruments, other than one for a vehicle.

It should be noted that in each of the above described embodiments, the comparators 400a and 400b that form the comparison circuit respectively form determination units that compare the temperature of the MOS transistors 21 and 31 with the threshold values, and determine whether the temperatures of the MOS transistors 21 and 31 have increased to the threshold values. In addition, when the temperature of any one of the power devices increases to the threshold value, the latch circuits 42a and 42b, the threshold value switching circuit, and the timer circuits 43a and 43b of the first embodiment, or the resistors 453a and 453b of the second embodiment, and so on, form an abnormal heat build-up response unit. This abnormal heat build-up response unit interrupts the current carried by the power device subject to the temperature increase; and changes the threshold values used in the determination unit for the temperature of the other power devices to the respective temperature threshold values that are higher than those used previously.

While the above description is of the preferred embodiments of the present invention, it should be appreciated that the invention may be modified, altered, or varied without deviating from the scope and fair meaning of the following claims.

What is claimed is:

1. A temperature protection device for a plurality of power devices, the plurality of power devices being housed within a single package, comprising:

a temperature detection unit that detects respective temperatures of the plurality of the power devices;

a determination unit that compares the respective temperatures, detected by the temperature detection unit, of the plurality of power devices and a threshold value, and determines whether any one of the respective temperatures of the power devices has increased to the threshold value; and an abnormal heat build-up response unit that, when it is determined by the determination unit that any one of the respective temperatures of the power devices has increased to the threshold value, interrupts the current carried by the power device whose temperature has increased, and changes the threshold value used by the determination unit for the temperature of the power devices amongst all the power devices that are disposed in positions that are thermally affected by the power device whose temperature has increased, to a threshold value that is set at a higher temperature than the previous threshold value.

2. The temperature protection device according to claim 1, wherein
the abnormal heat build-up response unit includes a unit that detects elapse of a predetermined time following execution of changing of the threshold value, and returns the changed threshold value to the original threshold value.

3. The temperature protection device according to claim 1, wherein
the abnormal heat build-up response unit includes a unit that, following execution of changing of the threshold value, returns the changed threshold value to the original threshold value when the temperature of the power device whose temperature has increased reduces to a predetermined temperature that is lower than the threshold value.

4. The temperature protection device according to claim 1, wherein
the temperature detection unit and the abnormal heat build-up response unit are housed along with the plurality of power devices within the single package.

5. A temperature protection device, comprising:
a first temperature detection unit and a second temperature detection unit that detect respective temperatures of a first power device and a second power device which are housed within a single package and which are disposed in positions at which mutual thermal affects occur;
a first determination unit that compares the temperature detected by the first temperature detection unit with a first threshold value, and determines whether the temperature of the first power device has increased to the first threshold value;
a second determination unit that compares the temperature detected by the second temperature detection unit with a second threshold value, and determines whether the temperature of the second power device has increased up to the second threshold value;
a first abnormal heat build-up response unit that, when it is determined by the first determination unit that the temperature of the first power device has increased to the first threshold value, interrupts the current carried by the first power device, and changes the second threshold value to a threshold value that is set at a higher temperature than the previous threshold value; and
a second abnormal heat build-up response unit that, when it is determined by the second determination unit that the temperature of the second power device has increased to the second threshold value, interrupts the current carried by the second power device, and changes the first threshold value to a threshold value that is set at a higher temperature than the previous threshold value.

6. A temperature protection device for a plurality of power devices, comprising:
a first temperature detection device and a second temperature detection device that detect respective temperatures of a first power device and a second power device which are housed within a single package and which are disposed in positions at which mutual thermal affects occur;
a first comparison circuit that compares the temperature detected by the first temperature detection device with a first threshold value, and outputs a first abnormal heat build-up detection signal when the temperature of the first power device has increased to the first threshold value;
a second comparison circuit that compares the temperature detected by the second temperature detection device with a second threshold value, and outputs a second abnormal heat build-up detection signal when the temperature of the second power device has increased to the second threshold value;
a first latch circuit that maintains the first abnormal heat build-up detection signal output from the first comparison circuit, and outputs the maintained first abnormal heat build-up detection signal to a driving circuit for driving the first power device so as to interrupt current carried by the first power device;
a first threshold value changing circuit that changes the second threshold value to a threshold value that is set at a higher temperature than the previous threshold value as a result of the first abnormal heat build-up detection signal output from the first comparison circuit;
a second latch circuit that maintains the second abnormal heat build-up detection signal output from the second comparison circuit, and outputs the maintained second abnormal heat build-up detection signal to a driving circuit for driving the second power device so as to interrupt current carried by the second power device; and
a second threshold value changing circuit that changes the first threshold value to a threshold value that is set at a higher temperature than the previous threshold value as a result of the second abnormal heat build-up detection signal output from the second comparison circuit.

7. The temperature protection device according to claim 6, further comprising:
a first timer circuit that detects that a predetermined time has elapsed since output of the first abnormal heat build-up detection signal, and returns the changed threshold value resulting from changing of the first threshold value to the original threshold value; and
a second timer circuit detects that a predetermined time has elapsed since output of the second abnormal heat build-up detection signal, and returns the changed threshold value resulting from changing of the second threshold value to the original threshold value.

8. The temperature protection device according to claim 6, further comprising;
a first changing circuit that changes the first threshold value to a threshold value that is set to a lower temperature than the previous threshold value, as a result of the first abnormal heat build-up detection signal output from the first comparison circuit; and
a second changing circuit that changes the second threshold value to a threshold value that is set to a lower temperature than the previous threshold value, as a result of the second abnormal heat build-up detection signal output from the second comparison circuit, wherein
the changed threshold value resulting from changing of the first threshold value is returned to the original threshold value as a result of cancellation of the first abnormal heat build-up detection signal output from the first comparison circuit, and
the changed threshold value resulting from changing of the second threshold value is returned to the original threshold value as a result of cancellation of the second abnormal heat build-up detection signal output from the second comparison circuit.

* * * * *